(12) United States Patent
Choi et al.

(10) Patent No.: US 6,510,096 B2
(45) Date of Patent: Jan. 21, 2003

(54) POWER DOWN VOLTAGE CONTROL METHOD AND APPARATUS

(75) Inventors: Jong-hyun Choi, Suwon (KR); Jei-hwan Yoo, Suwon (KR); Jong-eon Lee, Suwon (KR); Hyun-soon Jang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/981,945

(22) Filed: Oct. 17, 2001

(65) Prior Publication Data
US 2002/0158275 A1 Oct. 31, 2002

Related U.S. Application Data
(60) Provisional application No. 60/287,249, filed on Apr. 27, 2001.

(51) Int. Cl.$^7$ ................................................. G11C 8/02
(52) U.S. Cl. ......................................... 365/226; 365/227
(58) Field of Search ................................. 365/226, 194, 365/227, 189.08, 189.05, 191

(56) References Cited

U.S. PATENT DOCUMENTS

5,483,486 A * 1/1996 Javanifard et al. .......... 327/536
5,822,246 A * 10/1998 Taub et al. ............. 365/185.18
6,058,063 A * 5/2000 Jang ............................ 365/227

FOREIGN PATENT DOCUMENTS

JP            408124383 A    *   5/1996

* cited by examiner

Primary Examiner—Richard Elms
Assistant Examiner—Hien Nguyen
(74) Attorney, Agent, or Firm—F. Chau & Associates, LLP

(57) ABSTRACT

A semiconductor device for controlling entry to and exit from a power down mode (DPD) of a semiconductor memory, comprising a plurality of voltage generators for providing operating voltages to the semiconductor memory; a DPD controller for detecting a DPD condition and for generating a DPD signal to control the application of the operating voltages to the semiconductor memory; and circuitry for controlling the timing of turning on/off the plurality of voltage generators upon entry/exit of DPD mode to reduce surge current through the semiconductor memory to less than maximum current level.

28 Claims, 16 Drawing Sheets

PRIOR ART

DEEP POWER DOWN EXIT

POWER DOWN VOLTAGE CONTROL METHOD AND APPARATUS

CROSS REFERENCE

This application claims priority to provisional application, serial No. 60/287,249, filed on Apr. 27, 2001. The disclosure therein in its entirety is incorporated by reference herein.

This application is related to commonly assigned patent application Ser. No. 09/981,782.

BACKGROUND OF THE INVENTION

1. Field of the Invention

The present invention is directed to an internal voltage control method and apparatus in a semiconductor memory device and more particularly, to method and apparatus which reliably operate a volatile semiconductor memory and reduce current surges through internal circuits in the volatile semiconductor memory when entering, exiting, or operating in a power down mode.

2. Discussion of Related Art

It has long been a goal for semiconductor memory designers to design higher cell capacity and faster semiconductor memories that also consume less power. Since Dynamic Random Access Memories (DRAMs) have a smaller cell size than Static Random Access Memories (SRAMs) and thus offer more memory capacity for a given chip size than SRAMs, usage of DRAMs may be preferred in electronic devices having space limitations. However, DRAMs require constant refreshing and draw much more current than SRAMs. For use in a portable or mobile device, the smaller size advantage of DRAMs disappears if a larger battery is needed or if the battery requires constant recharging. As mobile devices are equipped with increased sophistication and functions, demand for increased memory capacity naturally is also increased. Therefore, low power DRAMs are very much in demand.

Various circuits have been designed to reduce DRAM power consumption. For example, when the DRAMs are not operating in active mode, the DRAMs are put in standby or power down modes in which less or minimal current is provided to refresh or hold DRAM data. U.S. Pat. No. 6,058,063 to Jang (the '063 patent) discloses a circuit for operating memory devices during standby or power-down mode. An external clock enable signal (CKE) is used to signal power-down mode and cut off power to certain circuits such as input buffers. FIG. 1A shows a circuit described in the '063 patent. A power down signal PBPUB derived from CKE goes from a low level to a high level to signal power down. PBPUB disconnects VCC by switching off Transistor 31 and pulls the output to ground by turning on Transistor 32. The disclosure of the '063 patent is incorporated by reference herein.

Recently, several DRAM manufacturers made proposals to JEDEC (Joint Electron Device Engineering Council) to standardize the use of a deep power down (DPD) signal for controlling entry and exit to and from a DPD operation mode in DRAMs. Proposals have been made to use the DPD signal to power down DRAMs when they are not in use, thus reducing power consumption.

Protocols for signaling DPD entry and exit modes proposed to JEDEC are shown in FIGS. 1B and 1C. FIG. 1B shows the protocol for DPD entry mode, wherein the DRAM is entering a deep power down mode. As shown in FIG. 1B, a DPD entry mode is signaled when a clock enable (CKE) signal, chip select (CS) signal, write enable (WE) signal go low, and row and column address strobe (/RAS and /CAS) signals stay high, triggered by a low to high CLOCK signal. FIG. 1C signals DPD exit. As shown, DPD exit mode is signaled when clock enable (CKE) goes high, triggered by a low to high CLOCK signal. As shown, the other signals do not affect DPD exit. It is understood that the protocol shown in FIGS. 1B and 1C are merely illustrative and variations to the protocol can be used or adopted for purposes of signaling power down entry and exit. For example, any or all of the control signals such as WE and CAS can have signal levels reversed from that shown or may not even be used to trigger CKE. Any equivalent clock enable signal can serve as CKE to invoke DPD entry and exit.

The proposed use of DPD is to power down the DRAM when the DRAM is not in active usage. Thus, upon entry in DPD mode, the various internal power voltage generators for supplying voltages such as cell capacitor plate voltage, internal array power voltage, internal peripheral power voltage, reference power voltage, etc. to internal circuits of the DRAM are turned off. Also turned off are nearly all the input buffers of the DRAM, except an auxiliary input buffer which will be kept on to receive the DPD exit mode signal.

In implementing DPD entry and exit, a large amount of input buffers and internal voltage generators are turned on and off at substantially the same time. This causes a large amount of current surging through the DRAM. A large current surge causes severe strain on the battery, generate heat and may render a circuit inoperable. Further, certain nodes in circuits turned off may be floating at unspecified voltages and if the circuits are not turned on properly, false triggering of internal circuitry of the DRAM may also occur.

Accordingly, a need exists for a device and method for implementing DPD entry and exit with minimal current surges. A need also exists for a method and device for preventing false triggering of circuits when the DRAM is operating during, entering or exiting DPD mode.

SUMMARY OF THE INVENTION

A semiconductor memory device capable of operation in Deep Power Down (DPD) mode, comprising a first transistor controlled by a DPD signal to apply bias voltage to a voltage control device; a second transistor controlled by the DPD signal to apply ground voltage to an output node of the voltage control device; and delay circuit for delaying the DPD signal to produce a delayed version of the DPD signal for selectively delaying the switching on and off of the first and second transistors.

Preferably, when the delayed version of DPD signal is applied the first transistor will disconnect the bias voltage from the voltage control device for a duration before and after the second transistor applies ground voltage to the output node of the voltage control device.

A semiconductor device is also provided for controlling entry to and exit from a power down mode (DPD) of a semiconductor memory, comprising a plurality of voltage generators for providing operating voltages to the semiconductor memory, a DPD controller for detecting a DPD condition and for generating a DPD signal to control the application of the operating voltages to the semiconductor memory; and circuitry for controlling the timing of turning on/off the plurality of voltage generators upon entry/exit of DPD mode to reduce surge current through the semiconductor memory to less than maximum current level, wherein the maximum current level is the current drawn by the semiconductor memory when the plurality of voltage generators switch from off to on or on to off at substantially the same time. The semiconductor memory is preferably a DRAM.

Preferably, the circuitry includes at least one drive transistor in each of the plurality of voltage generators for driving respective voltage generators to operating voltage levels when entering or exiting DPD mode, wherein the at least one drive transistor in each generator has drive capability different from other drive transistors to provide varied amount of current through the voltage generators when entering or exiting DPD mode.

According to another aspect of the invention, the circuitry includes at least one drive transistor in each of the plurality of voltage generators for driving respective voltage generators to operating voltage levels when entering or exiting DPD mode, and drive transistor control circuit for first turning on the at least one drive transistor in one of the plurality of voltage generators and then followed by turning on the drive transistors in the other voltage generators when entering or exiting DPD mode.

In one preferred embodiment, the circuitry includes a plurality of buffers, each connected to a respective voltage generator and each having a delay for delaying turning on/off corresponding voltage generators at different times according to the delay values of buffers when entering to and exiting from DPD mode, wherein the plurality of buffers include varying sizes of resistors and capacitors.

Alternatively, the circuitry includes a plurality of delay elements connected to the plurality of voltage generators for turning on/off the plurality of voltage generators at different times when entering or exiting DPD mode, wherein the plurality of delay elements are a plurality of buffers, each having an intrinsic delay, connected in series to one another, and each of the plurality of voltage generators is connected to a different output of the plurality of buffers.

A method is also provided for controlling entry to and exit from a power down mode (DPD) of a semiconductor memory, comprising, providing operating voltages to the semiconductor memory during active operation and cutting off operating voltages during DPD, detecting a DPD condition and generating a DPD signal to control the application of the operating voltages to the semiconductor memory, and variably turn on/off the plurality of voltage generators upon entry/exit of DPD mode to reduce surge current through the semiconductor memory to less than maximum current level, wherein the maximum current level is the current drawn by the semiconductor memory when the plurality of voltage generators switch from off to on or on to off at substantially the same time.

According to still another aspect of the invention, a semiconductor device is provided for controlling entry to and exit from a power down mode (DPD) of a semiconductor memory, comprising means for providing operating voltages to the semiconductor memory during active operation and cutting off operating voltages during DPD, means for detecting a DPD condition and for generating a DPD signal to control the application of the operating voltages to the semiconductor memory, and means for controlling the application of operating voltages to the semiconductor upon entry/exit of DPD mode to reduce surge current through the semiconductor memory to less than maximum current level.

The means for controlling includes a first transistor controlled by a first DPD signal to apply to bias voltage (VCC) to an operating voltage output node and a second transistor controlled by a second DPD signal for connecting ground (VSS) to the operating voltage output node, wherein the first DPD signal and the second DPD signal are selectively applied to the first transistor and the second transistor to prevent the first and second transistor from being turned-on at the same time.

Another method is provided for controlling entry to and exit from a power down mode (DPD) of a semiconductor memory, comprising providing operating voltages to the semiconductor memory during active operation and cutting off operating voltages during DPD, controlling a first transistor by a first DPD signal to apply a bias voltage (VCC) to an operating voltage output node, controlling a second transistor by a second DPD signal for connecting ground (VSS) to the operating voltage output node, wherein the first DPD signal and the second DPD signal are selectively applied to the first transistor and the second transistor to prevent the first and second transistor from being turned-on at the same time.

Preferably, the first DPD signal and the second DPD signal are generated with logic gates and delay elements, the first DPD signal and the second DPD signal being delayed versions of the DPD signal, wherein the second DPD signal transitions from low to high after a predetermined delay from the transition from low to high of the first DPD signal, wherein the logic gates and delay element include a two-input NAND gate and a two-input NOR gate, wherein each of the two-input NAND gate and two input NOR gate receive as inputs the DPD signal and a delayed version of the DPD signal through a respective first delay element and second delay element, the first delay element and the second delay element having different predetermined delay values.

The method preferably further including the step of controlling at least one-third transistor by the first DPD signal through a turn-on delay element wherein the first transistor is first turned on by the first DPD signal to apply the bias voltage (VCC) to the operating voltage output node when exiting DPD and the at least one third transistor is turned on by the first DPD signal after a turn-on delay provided by the turn-on delay element to increase drive capacity at the operating voltage output node.

BRIEF DESCRIPTION OF THE DRAWINGS

These and other features, advantages, and objects will appear from the following detailed description when considered in connection with the accompanying drawings in which similar reference characters denote similar elements throughout the figures of the drawings and wherein.

DETAILED DESCRIPTION OF PREFERRED EMBODIMENTS

According to preferred embodiments of the present invention, devices and methods are provided for operating internal circuits of DRAMs while entering, exiting and during a power save operation mode. According to aspects of the invention, leakage current during power save mode is reduced or eliminated, the amount of current surge during circuit turn on when exiting power save mode is reduced, and false triggering of internal circuits is eliminated. Preferred embodiments of the present invention act to reduce the current surge when the input buffers and internal power voltage generators are turned on when the semiconductor device enters or exits DPD mode. According to preferred methods of the present invention, a current surge is reduced by, for example, varying the setup times of the turn on of the internal power voltage generators, varying the drive capabilities of the different internal power voltage generators or buffers, delaying the turn on of the different voltage generators or buffers, or varying the slew rate of the voltage generators and input buffers. Although the present invention is described with the deep power down (DPD) entry and exit modes and the memory device described is a DRAM, it is to be appreciated that the present invention is applicable to any type of semiconductor memory devices operating in any of standby or power save modes.

Figure 1A:
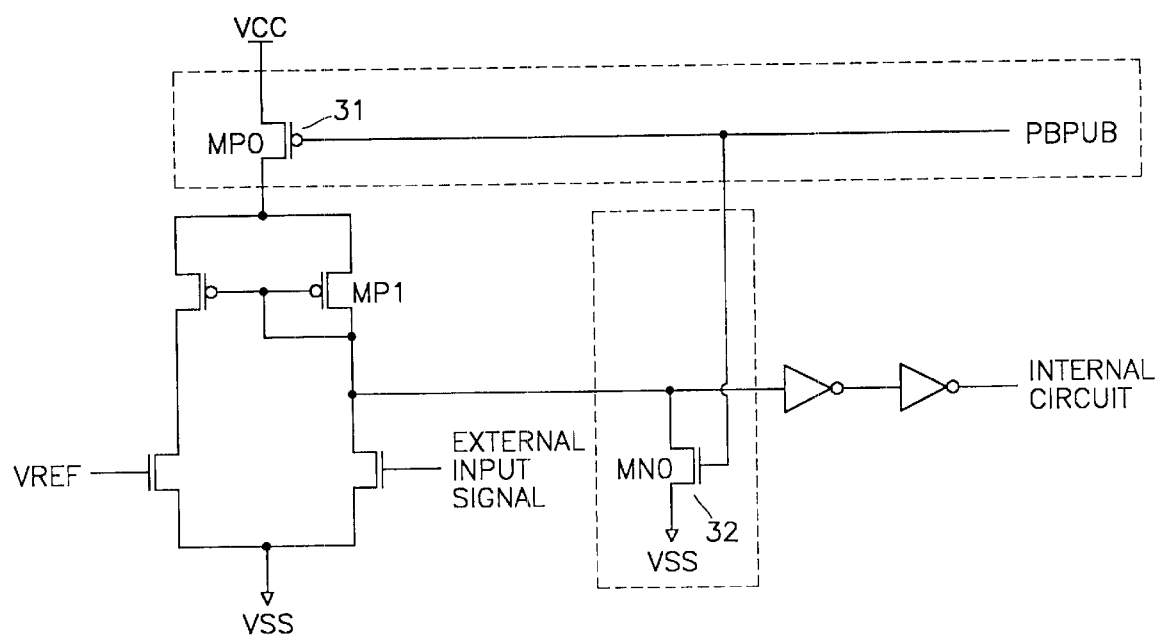
FIG. 1A shows a prior art circuit for operating a power down mode.
Figure 1B:
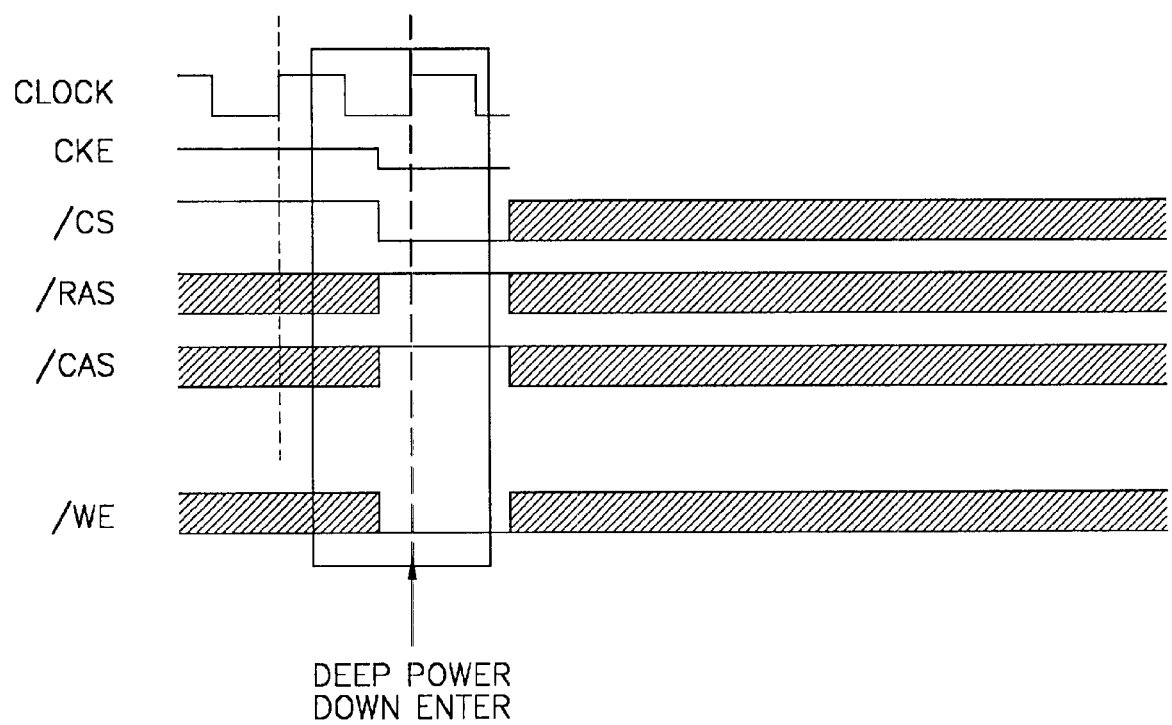
FIG. 1B shows a timing diagram of a deep power down (DPD) entry cycle.
Figure 1C:
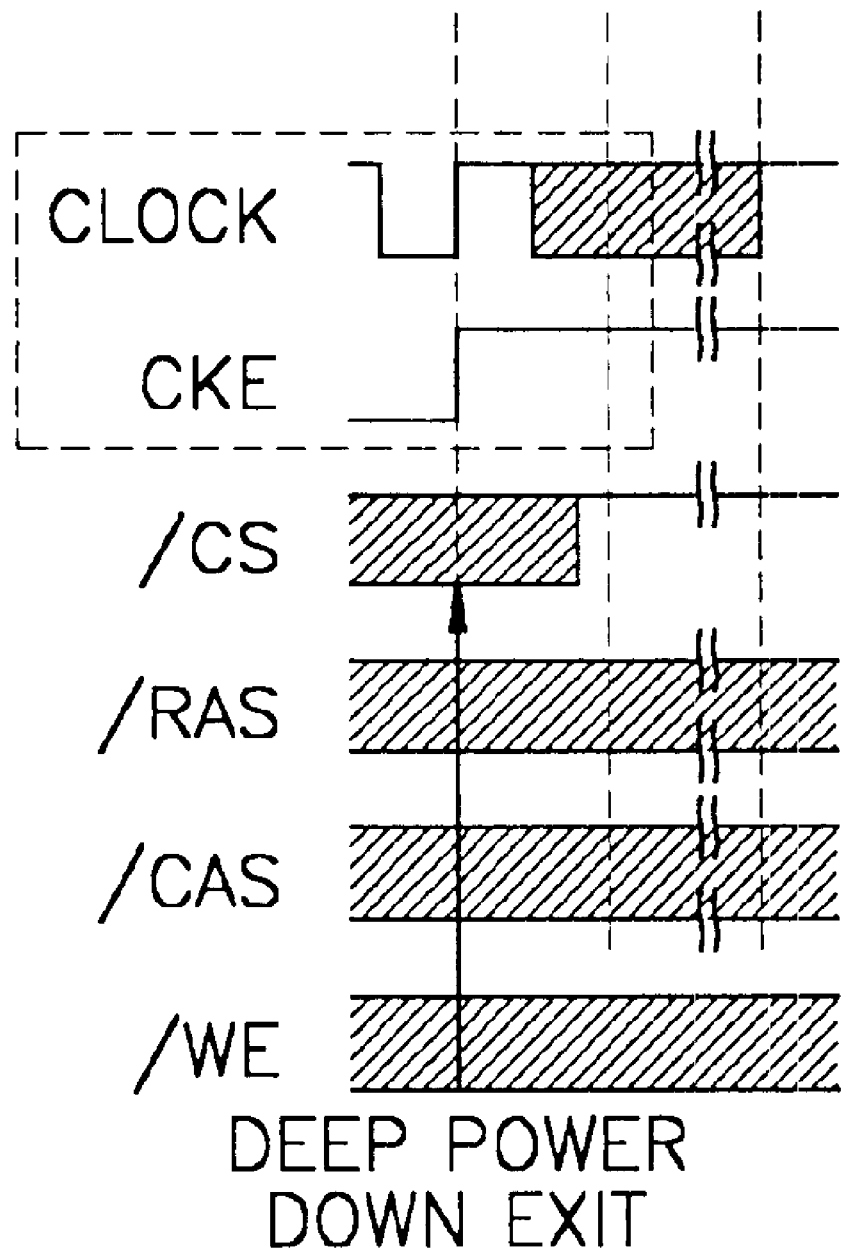
FIG. 1C shows a timing diagram of a DPD exit cycle.
Figure 2:
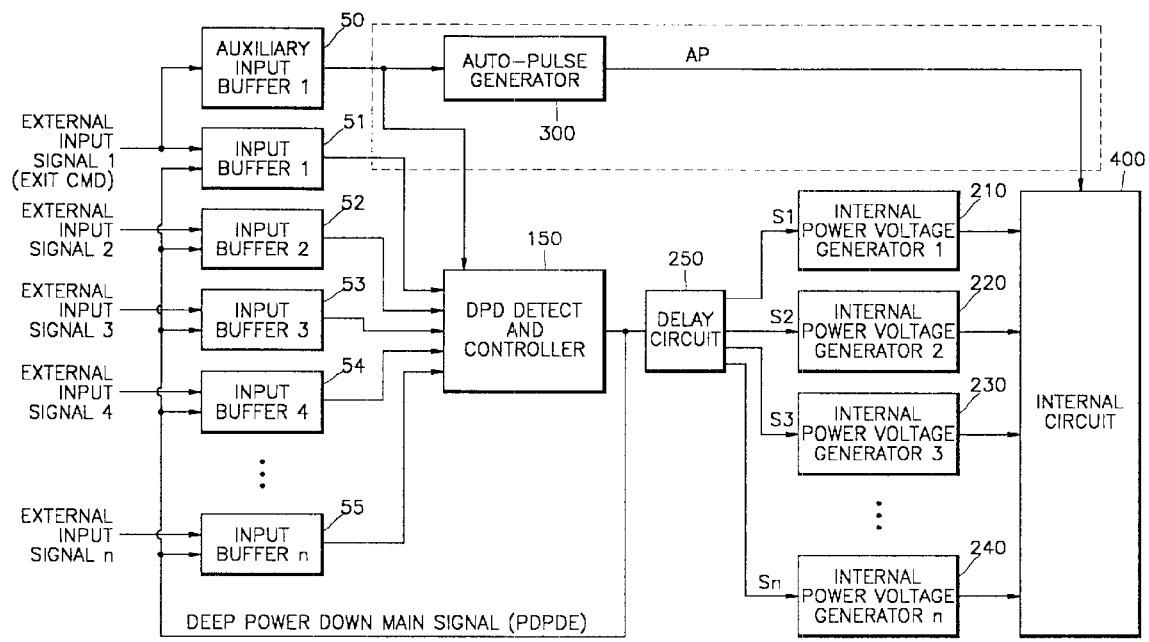
FIG. 2 shows a block diagram of a device for operation in DPD according to a preferred embodiment of the present invention.

FIG. 2 is a block diagram of a device for controlling a DRAM in deep power down mode according to a preferred embodiment of the present invention. Input buffers 51, 52, 53, 54 and 55 receive external input signals such as /CS, /RAS, /CAS, /WE, etc. and output them to DPD detect and controller 150. A plurality of internal power voltage generators 210, 220, 230 and 240 provide various bias and reference voltages such as plate voltage, internal array power voltage, substrate bias voltage, internal peripheral voltage(VINTP), and boost voltage, etc. to internal circuit 400 of the memory device. VINTP has characteristics which are common to other internal power voltages of the DRAM. For purposes of illustration of the operations of the embodiments of the present invention, it is understood that when VINTP is used in an explanation, such explanation is applicable to other internal power voltages of the DRAM. Briefly, when DPD detect and controller 150 detects a pre-assigned combination of signals from input buffers 51 to 55 that signals a DPD entry mode and exit mode (see for example, FIGS. 1B and 1C), a DPD command signal (PDPDE) is generated to turn off the various input buffers 51 to 55 and internal power voltage generators 210 to 240. According to the present embodiment, the outputs of internal power voltage generators 210 to 240 are pulled to VSS or ground. This feature is further described below. With the input buffers and voltage generators turned off, a very small amount of current flow and power is conserved.

Auxiliary input buffer 50 separately receives an external power down command signal such as CKE for signaling DPD entry and exit. According to a preferred embodiment of the invention, CKE will transition from low to high to signal DPD exit and high to low for DPD entry. Upon sensing the power down exit command, DPD detect and controller 150 signals a transition at PDPDE, for example, from high to low, and turns on the input buffers 51 to 55 and internal power voltage generators 210 to 240, providing passage of external data through the input buffers and application of bias and reference voltages to internal circuit 400.

Figure 3:
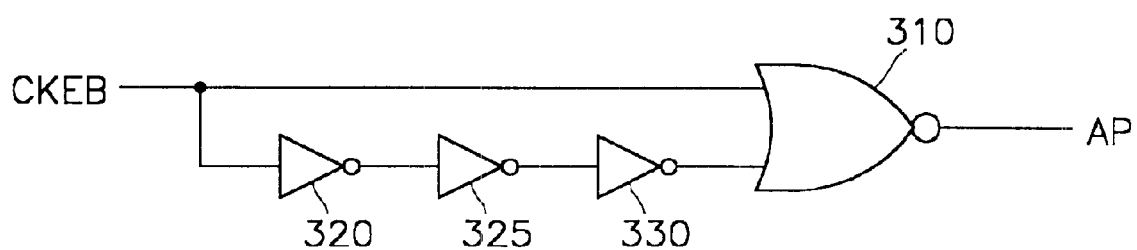
FIG. 3 shows a circuit for generating an auto-pulse signal.

With the internal power voltage generators 210 to 240 turned off during DPD mode, the circuits of internal circuit 400 are unbiased and many nodes of the circuits may float at some unspecified voltage level. When these circuits are turned on, the unspecified voltage levels may falsely trigger latches or other voltage level sensitive devices. If a voltage pulse is applied to the floating nodes prior to turn on, false triggering is eliminated. An auto pulse generator 300 detects the DPD exit command from auxiliary input buffer 50 and generates a pulse AP. The AP pulse is sent to internal circuit 400 to initialize the turning on of internal circuits. The auto pulse AP is applied to nodes of latch circuits within internal circuit 400 of the memory device. FIG. 3 shows an exemplary auto pulse generator. As shown in FIG. 3, the CKE signal buffered by auxiliary buffer 50 (CKEB) is applied directly to one of a two-input NOR gate 310. The same CKEB signal is passed through a series of inverters 320, 325, and 330 to invert and delay the CKEB signal to generate pulse AP at the output of NOR gate 310. This auto pulse generator generates a positive going pulse having a pulse width equal to the delay of inverters 320, 325, and 330. It can be appreciated by one skilled in the art that a low-going pulse can be generated by a circuit having an equivalent configuration as shown in FIG. 3 and a NAND gate is used. The AP plus can also be generated from the DPD command signal PDPDE in lieu of The CKEB signal.

Figure 4:
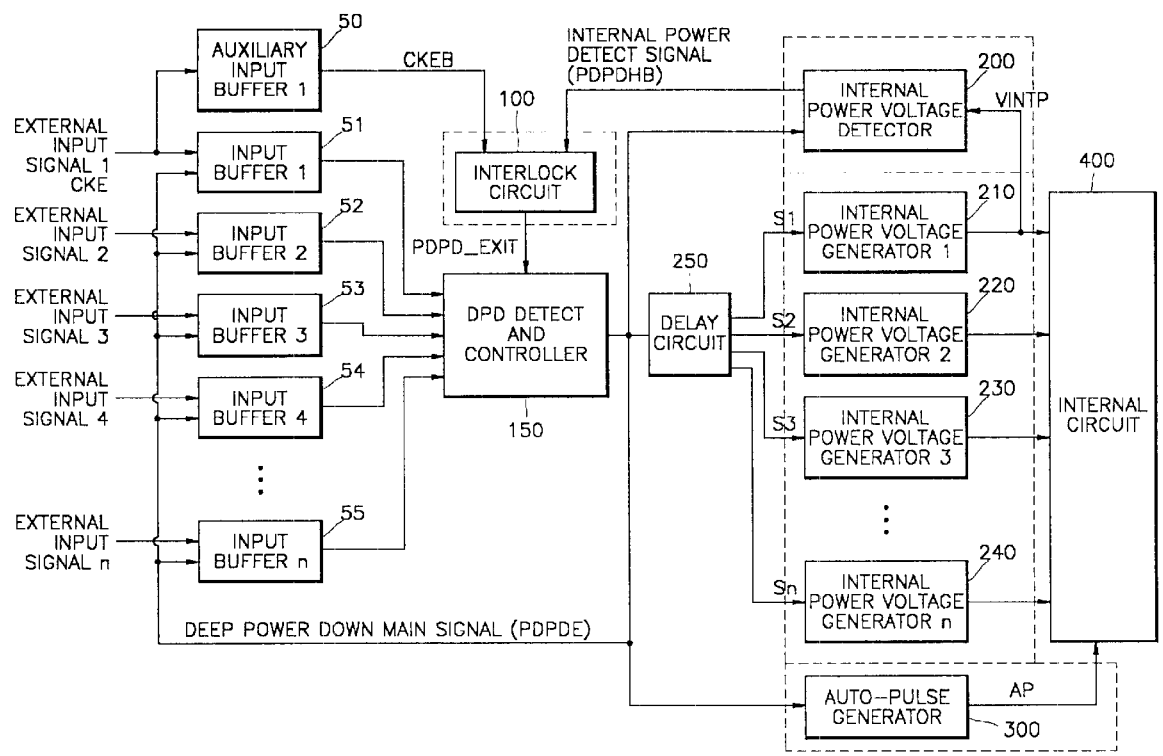
FIG. 4 shows a block diagram of a device for operating in DPD mode according to another preferred embodiment of the present invention.

FIG. 4 shows a block diagram of a device for controlling internal voltage generators and buffers of a DRAM during entering or exiting power down mode according to another embodiment of the present invention. This embodiment employs circuitry to prevent false entry or exit to or from DPD by 'locking-out' the external power down signal CKE if internal power voltage generators 210, 220, 230 or 240 are detected to be at an unspecified voltage level. According to the present embodiment, an internal power voltage detector 200 and an interlock circuit 100 are used to detect the voltage outputs of internal power voltage generators 210 to 240 and prevent the turn on of the voltage generators from a floating or unspecified voltage level when a DPD exit command is received.

Figure 5:
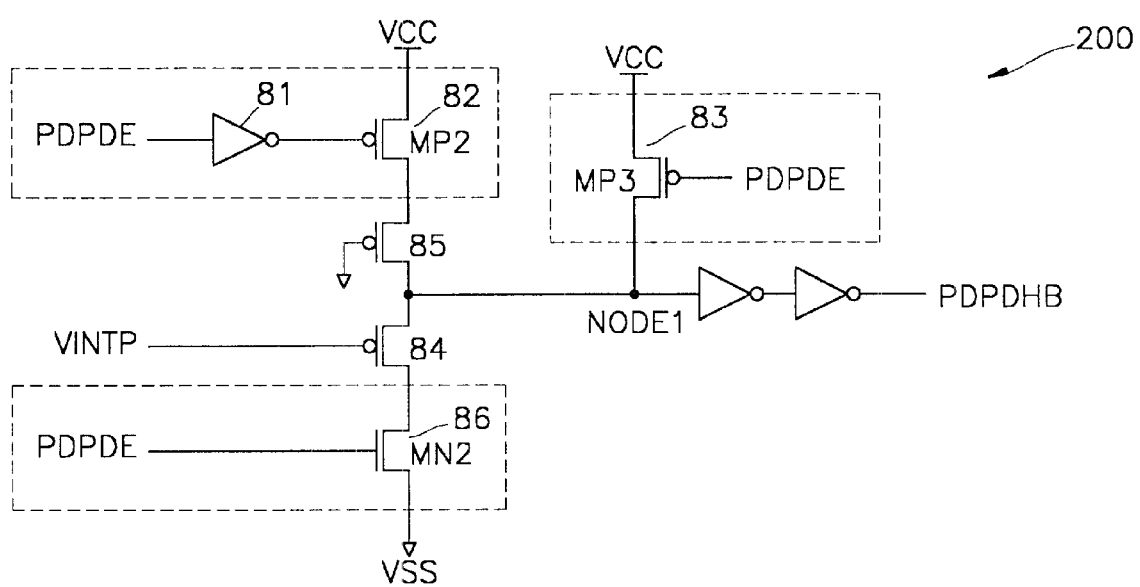
FIG. 5 shows an internal power voltage detector of FIG. 4.
Figure 6:
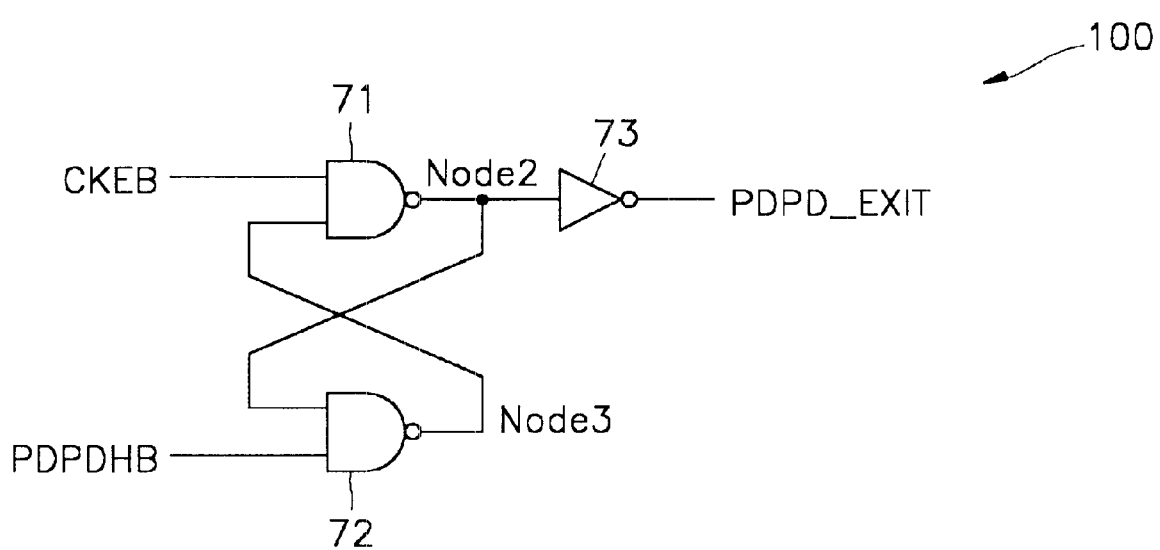
FIG. 6 shows an interlock circuit of FIG. 4.

An embodiment of the internal power voltage detector 200 is shown in FIG. 5 and an embodiment of interlock circuit 100 is shown in FIG. 6. Referring to FIGS. 4, 5, and 6, the DPD detect and controller 150 outputs control signal PDPDE, which is connected to input buffers 51 and 55 and internal voltage generators 210 to 240, to transition during entry and exit to and from DPD mode, e.g., with a low to high transition of PDPDE signaling for DPD entry mode and high to low transition of PDPDE for signaling a DPD exit mode. The PDPDE signal is connected to transistors MP2, MP3 and MN2 of the circuit in FIG. 5 to turn on the internal power voltage detector when the circuit has entered DPD mode (PDPDE transitioned from low to high). With PDPDE at high, transistors MP2 and MN2 are turned on, providing bias voltage through the transistor 85 to transistor 84 and through transistor MN2 to VSS. Transistor MP3 remains in an off state with PDPDE at high, thus floating node 1 at the output of transistor 84. The output of a representative internal power voltage generator, e.g., 210, at VINTP is connected to the input of transistor 84, which turn on when VINTP goes low. In such configuration, when the output of internal power voltage generator at VINTP is low and the PDPDE is at high during DPD mode, node 1 is pulled down to VSS or ground, and the output of internal power voltage detector 200 at PDPDHB is low. When VINTP is high and PDPDE is high, the voltage level at node 1, the output of transistor 84 is unspecified depending upon the state of transistor 84, which in turn depends on the voltage level of VINTP. If the circuit has exited DPD mode, the PDPDE signal is low, transistor MP2 and MN2 are turned off and transistor 84 is not biased. Transistor Mp3 is turned on to pull node 1 to high, the voltage of the external bias voltage VCC. Thus, when the circuit is in active mode, the internal voltage detector 200 is disabled and PDPDHB is high.

Referring to FIG. 6, an interlock circuit is used to prevent a false DPD exit condition. The output of the internal power voltage detector 200 at PDPDHB is applied to NAND gate 72, which is cross-coupled to NAND gate 71, which in turn receives at its input CKEB, the signal output from auxiliary buffer 50 (FIG. 4), which is a buffered signal of CKE used to signal DPD entry or exit. The CKEB signal is at a low level during DPD mode. The output of gate 71 at node 2 is forced to high, and the cross-coupled output of gate 72 is high, enabling gate 72. With PDPDHB at high, both inputs of gate 72 are high, node 3 is low, which is applied to input of NAND gate 71, and disabling NAND gate 71, with its output node 2 at high regardless of the level of CKEB. Thus, blocking an inadvertent CKEB signal from triggering a DPD exit. The CKEB signal is passed through when PDPDHB goes low. In other words, after the PDPDHB signal goes low, the CKEB signal at either low or high level, can be transferred to node 2. Low CKEB signal is from DPD exit command. The output of the interlock circuit 100 at PDPD_EXIT is connected to DPD detect and controller 150 to disable the generation of the PDPDE signal until the CKEB signal is passed through by interlock circuit 100.

When a circuit exits from DPD mode, the internal buffers and voltage generators turn on to apply bias and reference voltages to the internal circuit of the DRAM. In some instances, unintended DC paths may exist when the bias and reference voltages are applied and excessive current may flow. For example, referring to the prior art circuit of FIG. 1A, when power down command PBPUB goes from low to high, transistor MP0 is turning off while transistor MN0 is turning on. For a brief moment, both transistors MP0 and MN0 are conducting. If MP1 is on during this time, a current path exists from VCC through MP0, MP1 and MN0 to ground. Excess current can flow until MP0 is completely turned off. Likewise, when entering power down mode, PBPUB goes from high to low and transistor MP0 may turn on before transistor MN0 is completely off, and current may flow from VCC to VSS through MP1.

Figure 7:
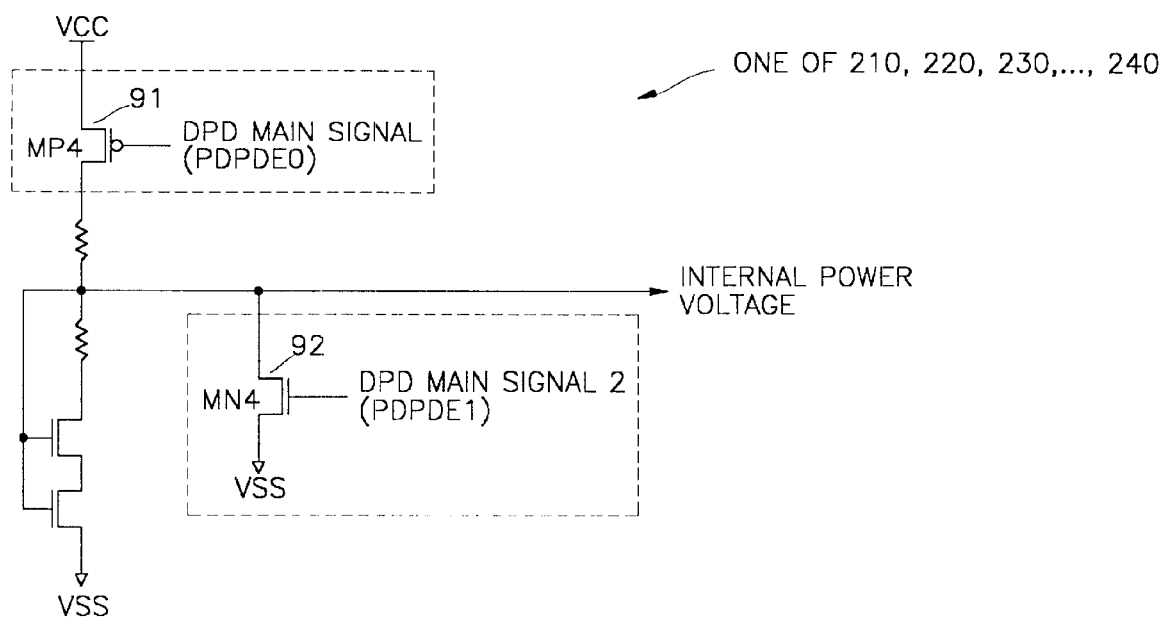
FIG. 7 shows a circuit for exiting DPD according to an embodiment of the present invention.

FIG. 7 shows circuitry applicable to internal power voltage generators for turning on and off the voltage generators when entering and exiting DPD modes without excessive current flow or false triggering.

Figure 8:
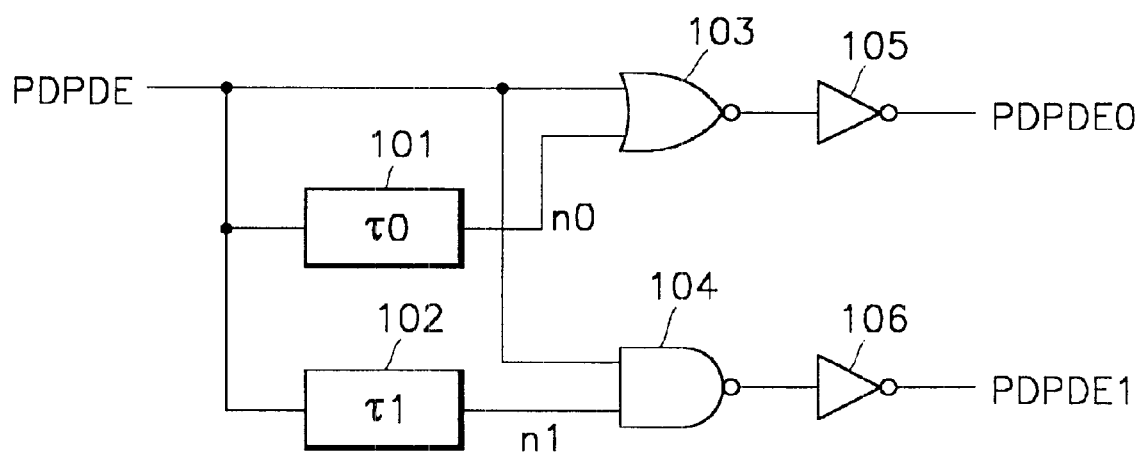
FIG. 8 shows a device for splitting a DPD command signal useable to operate the circuit of FIG. 7.
Figure 9:
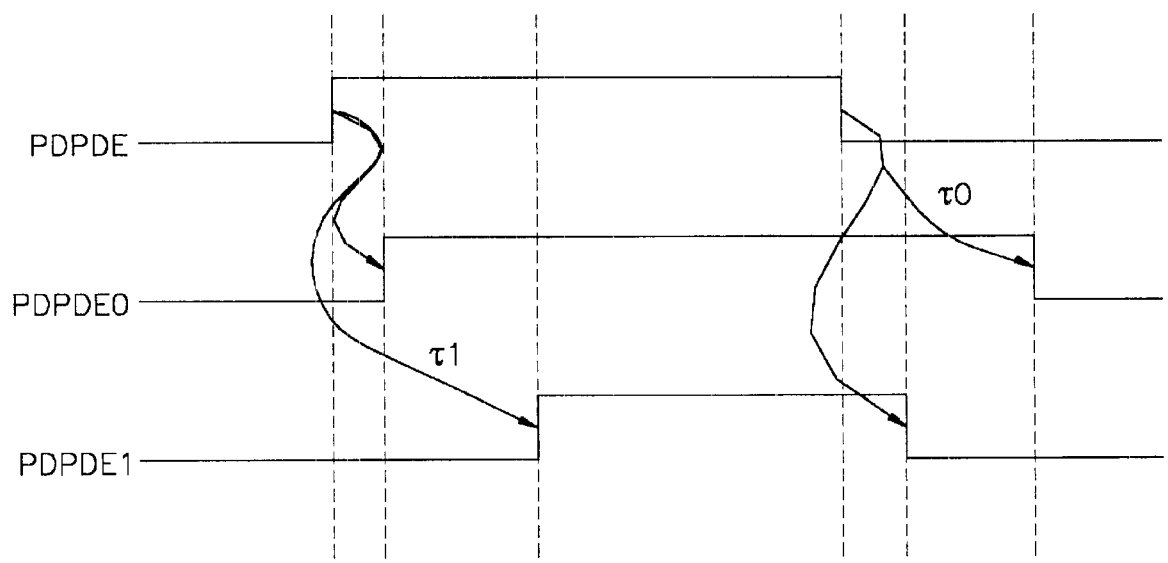
FIG. 9 shows a timing diagram of the operation of the circuit of FIG. 8.

FIG. 8 shows circuitry for splitting the DPD command signal PDPDE into signals PDPDE0 and PDPDE1 for applying to the circuit of FIG. 7. The operation of FIGS. 7 and 8 ensures that transistors MP4 and MN4 do not turn on at the same time. FIG. 9 shows a timing diagram of the generation of PDPDE0 and PDPDE1 signals from PDPDE by the circuit of FIG. 8. Referring to FIGS. 8 and 9, the PDPDE command signal is applied to a two input NOR gate 103 and a two input NAND gate 104 through delays 101 and 102, respectively. Upon occurrence of a low to high pulse of PDPDE, the output of NOR gate 103 immediately goes from high to low and a low to high pulse of PDPDE0 through inverter 105 will be generated. Since both inputs of NAND gate 104 must be high for its output to be low, the low to high transition of PDPDE1 (through inverter 106) does not occur until the low to high transition arrives at the second input of NAND gate 104 through delay 102. Thus, the transition of PDPDE1 from low to high occurs later than PDPDE0, at least by the amount of time of delay 102. Conversely, when PDPDE goes from high to low, the output of NAND gate 104 goes from low to high and PDPDE1 goes from high to low through inverter 106. PDPDE0 goes from high to low only when both inputs of NOR gate 103 are low. The high to low transition of PDPDE0 occurs later than PDPDE1, at least by an amount of time of delay 101.

Referring now to FIG. 7, with PDPDE0 applied to transistor MP4 and PDPDE1 applied to transistor MN4, during the deep power down enter mode (PDPDE goes from low to high level), the internal power voltage generator is turned off through PMOS transistor MP4 to turn off the internal power voltage generator and with PDPDE1 going high after the PDPDE0 going high, NMOS transistor MN4 will be turned on only after MP4 is turned off, cutting off VCC. The internal power voltage will be pulled down to VSS and no current can flow through MP4 to VSS through MN4. During the deep power down exit mode, PDPDE goes from high to low and PDPDE1 goes low before PDPDE0 goes low (see FIG. 9). Transistor MN4 is thus turned off by PDPDE1 before transistor MP4 is turned on to provide bias voltage to the circuit and allowing internal power voltage mode to operate normally. It can be seen that the circuits of FIGS. 7 and 8 prevent any transient DC path and thus current flow between VCC and VSS in the circuit of FIG. 7 during both DPD entry and exit operations.

Another consideration of a circuit operating to enter and exit deep power down mode is current surge. When a circuit is powered down or in DPD mode, input buffers and internal power voltage generators are turned off, a minimal amount of current flows through the circuit. When a circuit exits from the DPD mode, the input buffers and internal power voltage generators that were kept off during DPD mode are now turned on at substantially the same time, causing a large current surge, which severely strains the battery and may render inoperative the internal circuits of a semiconductor memory device. Preferred embodiments of the present invention act to reduce the current surge when the input buffers and internal power voltage generators are turned on when the semiconductor device enters or exits DPD mode. According to preferred methods of the present invention, a current surge is reduced by, for example, varying the setup times of the turn on of the internal power voltage generators, varying the drive capabilities of the different internal power voltage generators or buffers, delaying the turn on of the different voltage generators or buffers, or varying the slew rate of the voltage generators and input buffers.

Figure 10:
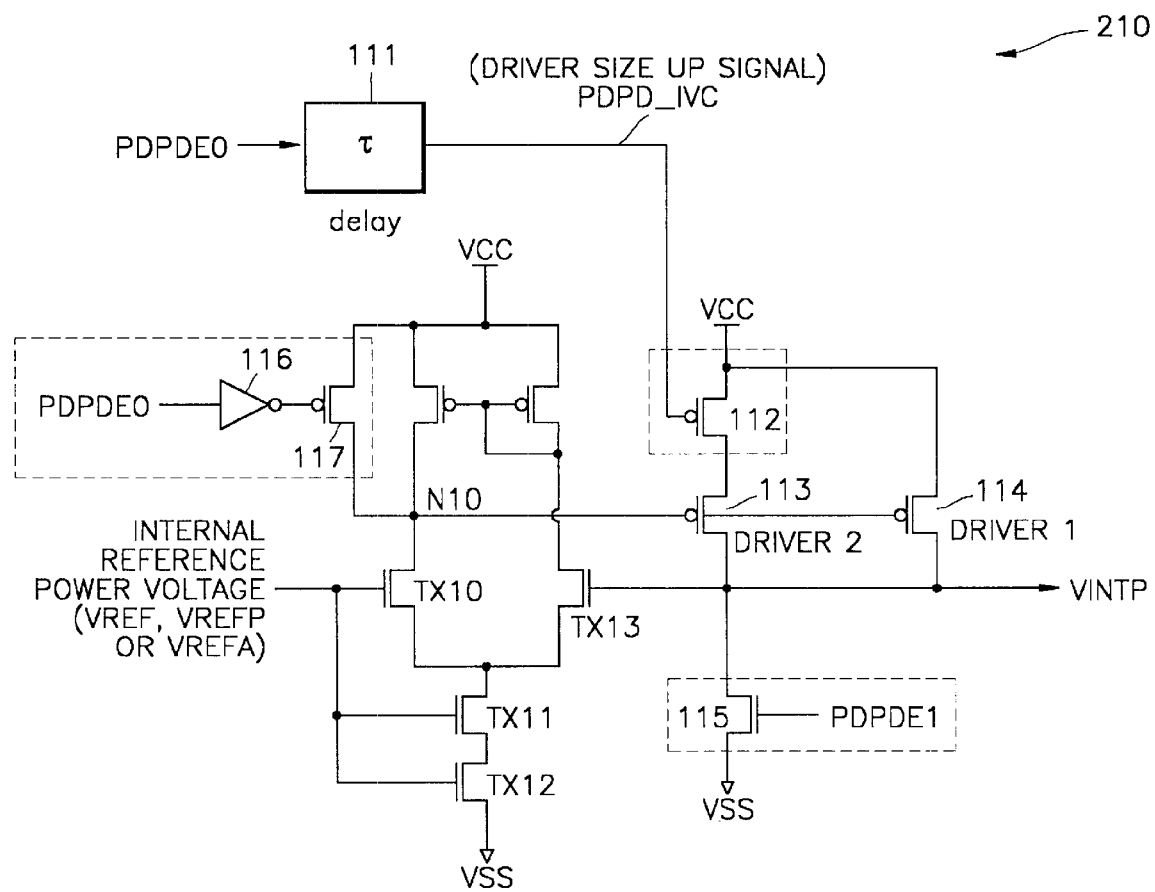
FIG. 10 shows a device for varying setup time for turning on an internal circuit of a memory according to a preferred embodiment of the present invention.

FIG. 10 depicts one embodiment for varying the drive set up of the internal power voltage generators. Referring to FIG. 10, when the device is in DPD mode, DPD command signal PDPDE is high and its derivative signals PDPDE0 and PDPDE1 are also high. Transistor 115 is turned on to pull down the internal power voltage VINTP to VSS. Transistor 117 is turned on to pull VCC to the gates of transistors 113 and 114 to keep them off. When a DPD exit command is detected, (PDPDE0 and PDPDE1 goes from high to low), transistor 117 is turned off and transistor 115 is turned off. The internal reference power voltages from the internal power voltage generators are provided to turn on transistors TX10, TX11 and TX12 to pull node N10 toward VSS. Transistor 114 (driver 1) begins to turn on to drive the internal power voltage VINTP towards VCC. Transistor 112 receives as gate input a delayed version of PDPDE0 for turning on transistor 112 after the turn on of the transistor 114. Upon turn on of transistor 112, transistor 113 is biased to turn on for providing further driving capability at VINTP. It can be seen that the turn on rate of internal power voltage VINTP provided to internal circuit 400 of the semiconductor device can be varied by varying the size of transistor 114 and by adding transistor 113. Thus, if different size drivers (e.g., transistor 114) are in different internal power voltage generators, the internal power voltages provided to different portions of internal circuit 400 of the semiconductor device can be turned on at different rates. Advantageously, the different rates of biasing the internal circuit 400 according to the illustrative embodiment of the present invention act to reduce current surge when DPD exits.

Figure 11:
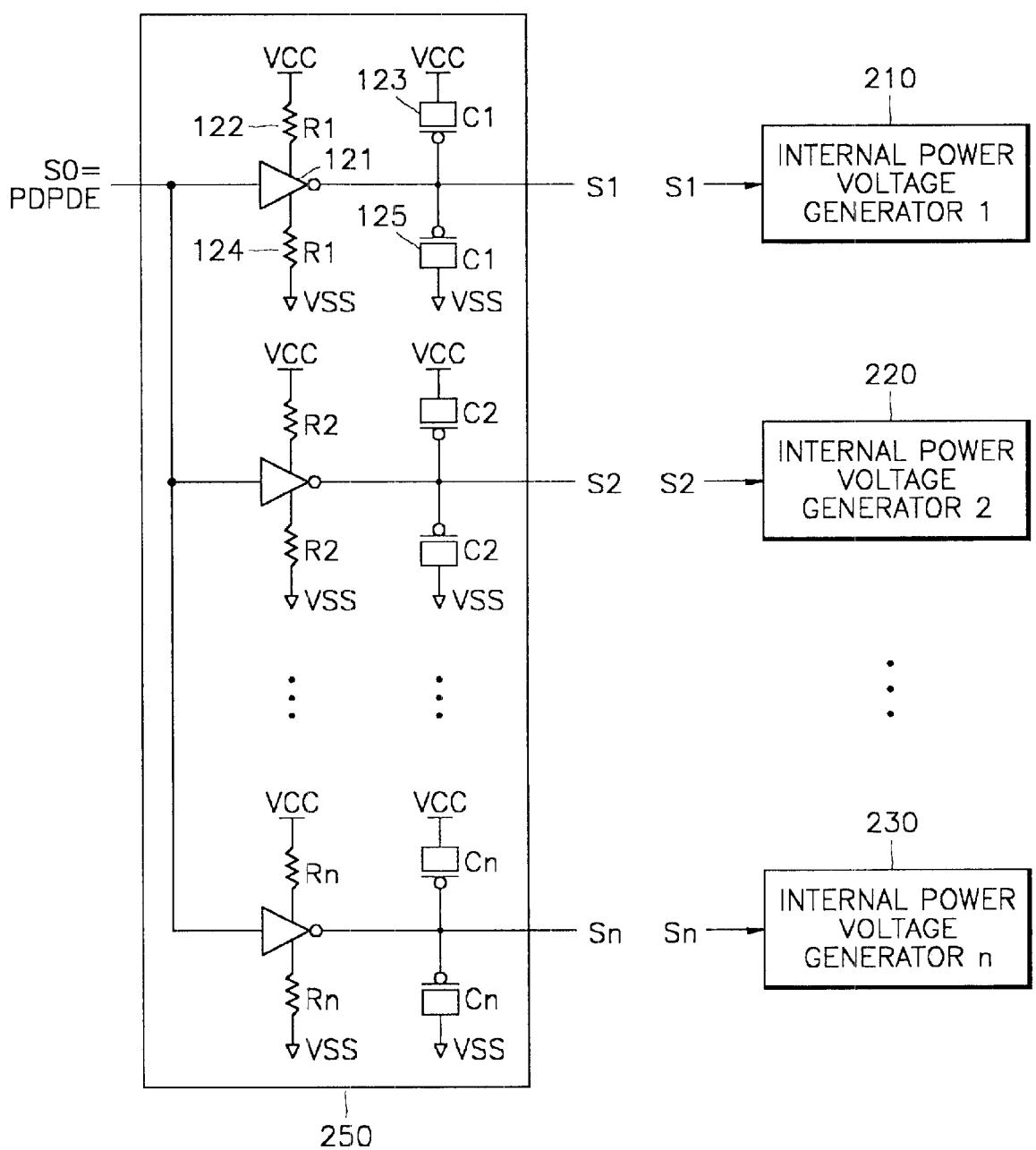
FIG. 11 shows a circuit for varying the speed of a DPD command.
Figure 12:
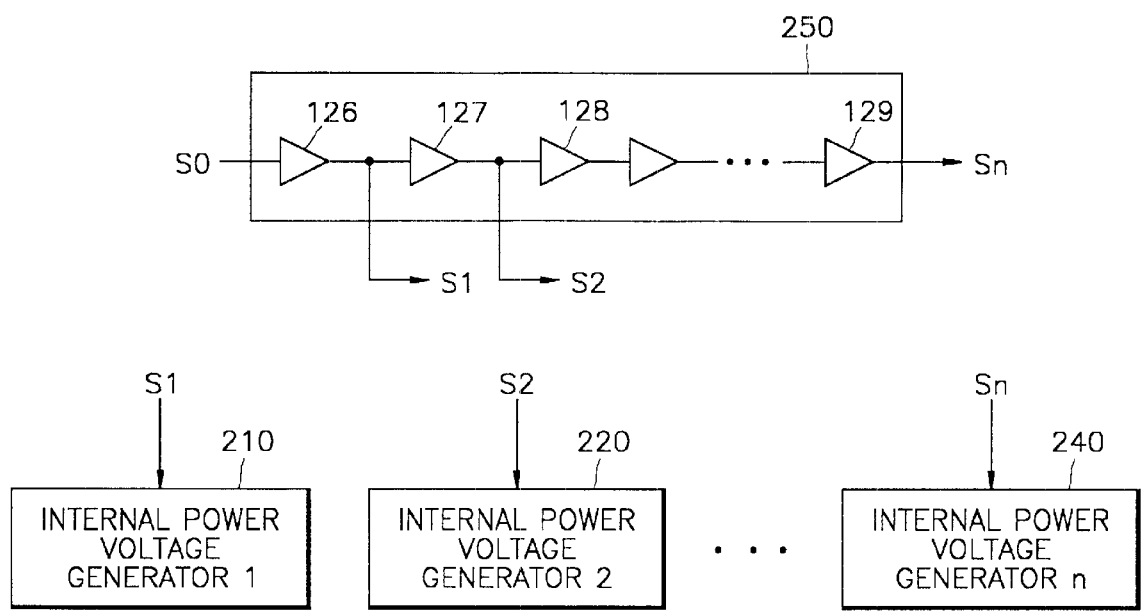
FIG. 12 shows another circuit for varying the speed of a DPD command.

Another method for varying the turn on of internal power voltages is by varying the turn on of the internal power voltage generators. According to an embodiment of the present invention, the DPD command signal PDPDE is delayed so that the command arrives at the different internal power voltage generators at different times, thereby causing turn on of the internal power voltage generators at different times. FIGS. 11 and 12 show illustrative embodiments for varying the time of arrival of DPD command signal PDPDE. Referring to FIG. 11, the DPD command signal PDPDE is sent to the internal power voltage generators 210, 220, 230 and 240 through inverters/amplifiers such as 121. The speed of the signals applied to the internal voltage generators (S1, S2 . . . SN) can be individually adjusted by varying the size of resistors R1, R2, . . . RN and capacitors C1, C2, . . . CN. The different RC time constants applied to inverters/amplifiers will vary the time of arrival of PDPDE at S1, S2 . . . SN, thus turning on/off the internal power voltage generators at different times.

Referring to FIG. 12, the DPD command signal PDPDE is fed through a series of buffers 126, 127, 128, 129, each of the buffers 126 to 129 having an intrinsic delay. The S1, S2, S3 . . . SN signals apply to respective power voltage generators 210, 220 . . . 240. By selecting different outputs of buffers 126, 127 . . . 129 to apply to the internal power voltage generators, the internal power voltage generators are caused to turn on at different times.

Figure 13:
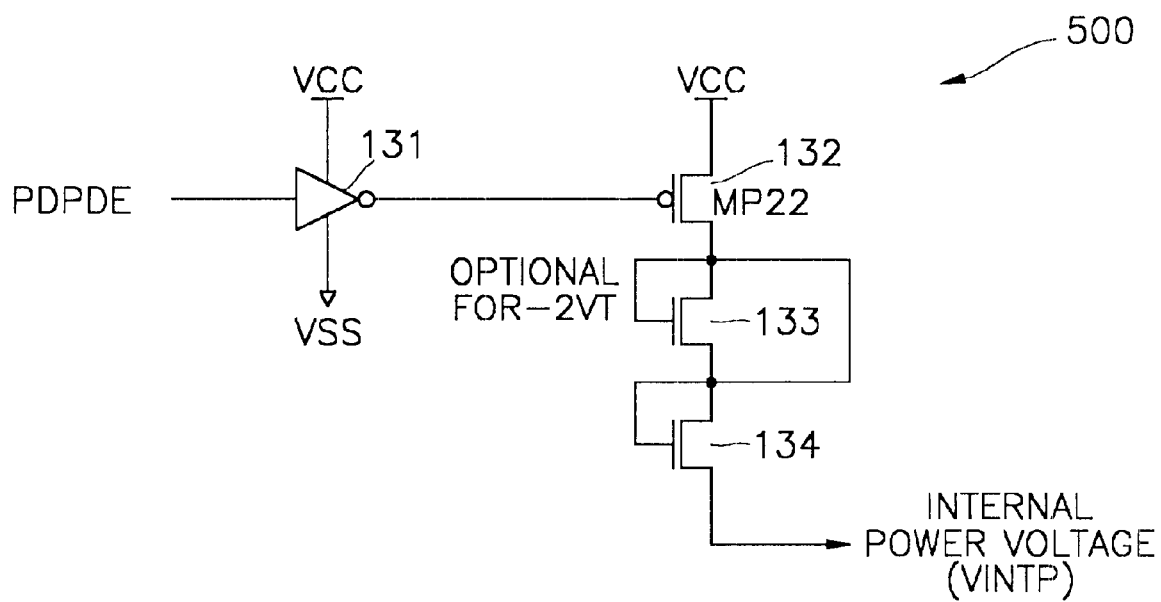
FIG. 13 shows a circuit for maintaining a voltage applied to an internal circuit during DPD mode.
Figure 14:
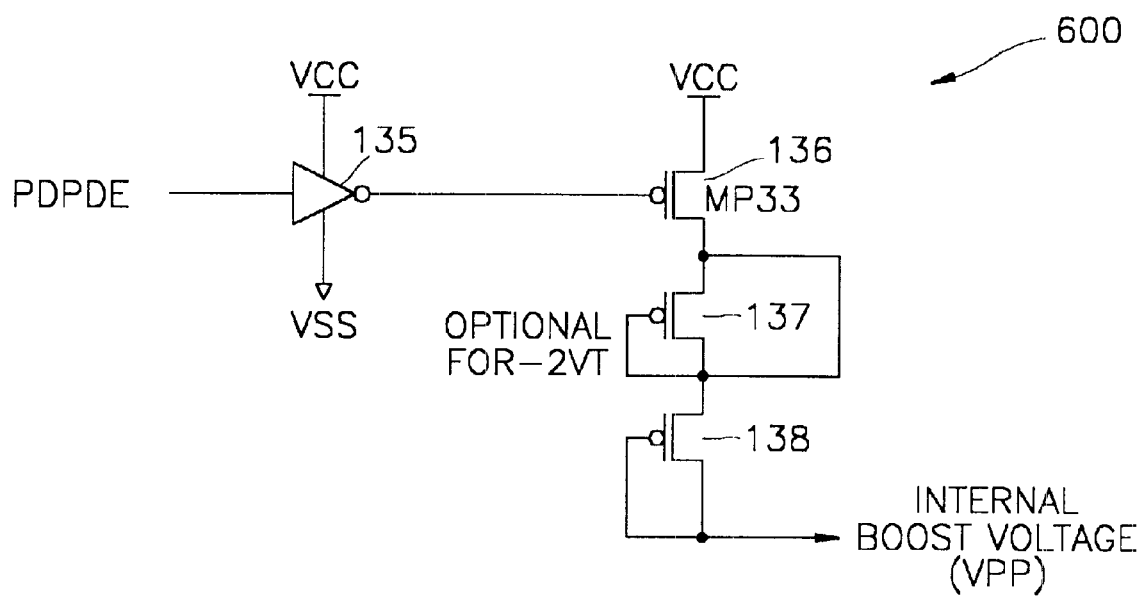
FIG. 14 shows another circuit for maintaining a voltage applied to an internal circuit during DPD mode.

According to still another aspect of the present invention, when a semiconductor device such as a DRAM is put in a deep power down mode, the voltages output from internal power voltage generators applied to internal circuit 400 of the semiconductor device are generally pulled down to ground or VSS so that only minimal current flows through internal circuit 400. In certain instances, it may be advantageous to maintain certain portions of internal circuit 400 at a predetermined voltage level other than VSS even during DPD mode. For example, it may be advantageous to maintain a predetermined voltage level to peripheral or boost circuits at all times, even during power down mode, so that the affected circuits need not be turned on from ground or can turn on at a much quicker rate. FIGS. 13 and 14 show embodiments of the present invention for providing voltages to internal circuit 400 at VINTP. Referring to FIG. 13, a circuit for maintaining predetermined voltage level at VINTP according to an embodiment of the present invention, DPD command signal PDPDE is applied through inverter 131 to transistor 132. The inverter 131 and transistor 132 are biased by an external power voltage VCC. During power down mode, PDPDE is high, transistor 132 is turned on, pulling VCC to the gate of transistor 134, turning it on.

The voltage at internal power voltage VINTP is pulled up towards VCC at the predetermined level. Such level is maintained during DPD mode. The predetermined voltage level at VINTP is the voltage level of VCC minus the threshold voltage drop of transistor 134 operating as a diode and the voltage drop across transistor 132 when it is turned on. Transistor 133 is connected to provide a further voltage drop in the amount equivalent to the threshold voltage of a diode. When needed, the fuse connected across the transistor 133 is cut. Metal line connections can be selectively used in place of the fuses to vary the voltage level at VINTP. When the device exits from DPD mode, DPD command signal PDPDE goes from high to low, turning off transistor 132 and transistor 134. Internal power voltage at VINTP is then floated and a voltage applied from an internal power voltage generator from any of 210, 220, . . . 240 is applied to VINTP to operate at normal operating level.

Referring to FIG. 14, a circuit for providing a predetermined boost voltage during DPD mode according to a preferred embodiment of the present invention is provided. Similar to the circuit of FIG. 13, when PDPDE is high during DPD mode, transistor 136 is turned on. The internal boost voltage VPP applied to a boost circuit within internal circuit 400 is pulled toward external power voltage VCC through transistor 138, which is connected in a configuration of a diode. Transistor 138 is preferably an NMOS transistor. Transistor 137 provides a further voltage adjustment to the level of boost voltage VPP. If needed, the fuse connected across transistor 137 is cut to provide another voltage drop equivalent to the threshold voltage of transistor 137. Again, it is apparent to one skilled in the art that metal lines can be optionally used in place of the fuses. When the semiconductor device exits from DPD mode, PDPDE goes low, transistors 136 and 138 turn off and boost voltage VPP is floated and driven by the voltage generated by one of the internal power voltage generators to provide VPP at a normal operating level. Thus, the internal power voltage generators can be selectively made to maintain at predetermined levels while other internal power voltage generators are turned off and voltages are pulled down to VSS during power down mode.

In the drawings and specification, there have been disclosed illustrative preferred embodiments of the invention and, although specific terms and types of devices are employed, they are used in a generic and descriptive sense only and not for purposes of limitation. For example, although specific logic circuit gates or electronic components described to implement preferred functions of the invention, one skilled in the art can implement the functions with equivalent logic or electronic components. Thus, numerous modifications and variations of the present invention are possible in light of the above teachings. It is therefore to be understood that, within the scope of the appended claims, the present invention can be practiced in a manner other than as specifically described herein.

What is claimed is:

1. A semiconductor device for controlling entry to and exit from a power down mode (DPD) of a semiconductor memory, comprising;
   a plurality of voltage generators for providing operating voltages to the semiconductor memory;
   a DPD controller for detecting a DPD condition and for generating a DPD signal to control the application of the operating voltages to the semiconductor memory; and
   circuitry for controlling the timing of turning on/off the plurality of voltage generators upon entry/exit of DPD mode to reduce surge current through the semiconductor memory to less than maximum current level.

2. The device of claim 1, wherein the maximum current level is the current drawn by the semiconductor memory when the plurality of voltage generators switch from off to on or on to off at substantially the same time.

3. The device of claim 1, wherein the semiconductor memory is a DRAM.

4. The device of claim 1, wherein the circuitry includes at least one drive transistor in each of the plurality of voltage generators for driving respective voltage generators to operating voltage levels when entering or exiting DPD mode, wherein the at least one drive transistor in each generator has drive capability different from other drive transistors to provide varied amount of current through the voltage generators when entering or exiting DPD mode.

5. The device of claim 1, wherein the circuitry includes at least one drive transistor in each of the plurality of voltage generators for driving respective voltage generators to operating voltage levels when entering or exiting DPD mode, and drive transistor control circuit for first turning on the at least one drive transistor in one of the plurality of voltage generators and then followed by turning on the drive transistors in the other voltage generators when entering or exiting DPD mode.

6. The device of claim 1, wherein the circuitry includes a plurality of buffers, each connected to a respective voltage generator and each having a delay for delaying turning on/off corresponding voltage generators at different times according to the delay values of buffers when entering to and exiting from DPD mode.

7. The device of claim 6 wherein the plurality of buffers include varying sizes of resistors and capacitors.

8. The device of claim 1, wherein the circuitry includes a plurality of delay elements connected to the plurality of voltage generators for turning on/off the plurality of voltage generators at different times when entering or exiting DPD mode.

9. The device of claim 8, wherein the plurality of delay elements are a plurality of buffers, each having an intrinsic delay, connected in series to one another, and each of the plurality of voltage generators is connected to a different output of the plurality of buffers.

10. The device of claim 1, wherein the circuitry includes means for turning on/off the plurality of voltage generators at different times when entering or exiting DPD mode.

11. A method for controlling entry to and exit from a power down mode (DPD) of a semiconductor memory, comprising;
providing operating voltages to the semiconductor memory during active operation and cutting off operating voltages during DPD;
detecting a DPD condition and generating a DPD signal to control the application of the operating voltages to the semiconductor memory; and
variably turn on/off the plurality of voltage generators upon entry/exit of DPD mode to reduce surge current through the semiconductor memory to less than maximum current level.

12. The method of claim 11, wherein the maximum current level is the current drawn by the semiconductor memory when the plurality of voltage generators switch from off to on or on to off at substantially the same time.

13. The method of claim 11, wherein the semiconductor memory is a DRAM.

14. The method of claim 11, wherein the step of variably turning on/off the voltage generators includes providing varied drive capabilities at different voltage generators.

15. The method of claim 11, wherein the step of variably turning on/off the voltage generators includes first turning on at least one drive transistor in one of the plurality of voltage generators and then followed by turning on drive transistors in another of the voltage generators.

16. The method of claim 11, wherein the step of variably turning on/off the voltage generators includes variably delaying turning on/off voltage generators at different times according to different delays.

17. The method of claim 16, wherein the different delays correspond to a plurality of buffers, each having varying sizes of resistors and capacitors.

18. The method of claim 16, wherein the different delays correspond to a plurality of buffers, each having an intrinsic delay, connected in series to one another, and each of the plurality of voltage generators is connected to a different output of the plurality of buffers.

19. A semiconductor device for controlling entry to and exit from a power down mode (DPD) of a semiconductor memory, comprising;
means for providing operating voltages to the semiconductor memory during active operation and cutting off operating voltages during DPD;
means for detecting a DPD condition and for generating a DPD signal to control the application of the operating voltages to the semiconductor memory; and
means for controlling the application of operating voltages to the semiconductor upon entry/exit of DPD mode to reduce surge current through the semiconductor memory to less than maximum current level.

20. The device of claim 19, wherein the maximum current level is the current drawn by the semiconductor memory when the plurality of voltage generators switch from off to on or on to off at substantially the same time.

21. The device of claim 19, wherein the means for controlling includes a first transistor controlled by a first DPD signal to apply a bias voltage (VCC) to an operating voltage output node and a second transistor controlled by a second DPD signal for connecting ground (VSS) to the operating voltage output node, wherein the first DPD signal and the second DPD signal are selectively applied to the first transistor and the second transistor to prevent the first and second transistor from being turned-on at the same time.

22. The device of claim 21, further including means for generating the first DPD signal and the second DPD signal from the DPD signal, the means for generating includes logic gates and delay elements to generate delayed versions of the DPD signal as the first DPD signal and the second DPD signal so that the second DPD signal transitions from low to high after a predetermined delay from the transition from low to high of the first DPD signal.

23. The device of claim 22, wherein the logic gates and delay elements include a two-input NAND gate and a two-input NOR gate, wherein each of the two-input NAND gate and two input NOR gate receive as inputs the DPD signal and a delayed version of the DPD signal through a respective first delay element and second delay element, the first delay element and the second delay element having different predetermined delay values.

24. The device of claim 21, further including at least one-third transistor controlled by the first DPD signal through a turn-on delay element wherein the first transistor is first turned on by the first DPD signal to apply the bias voltage (VCC) to the operating voltage output node when exiting DPD and the at least one third transistor is turned on by the first DPD signal after a turn-on delay provided by the turn-on delay element to increase drive capacity at the operating voltage output node.

25. A method for controlling entry to and exit from a power down mode (DPD) of a semiconductor memory, comprising;
  providing operating voltages to the semiconductor memory during active operation and cutting off operating voltages during DPD;
  controlling a first transistor by a first DPD signal to apply a bias voltage (VCC) to an operating voltage output node;
  controlling a second transistor by a second DPD signal for connecting ground (VSS) to the operating voltage output node, wherein the first DPD signal and the second DPD signal are selectively applied to the first transistor and the second transistor to prevent the first and second transistor from being turned-on at the same time.

26. The method of claim 25, including the step of generating the first DPD signal and the second DPD signal from the DPD signal, with logic gates and delay elements, the first DPD signal and the second DPD signal being delayed versions of the DPD signal, wherein the second DPD signal transitions from low to high after a predetermined delay from the transition from low to high of the first DPD signal.

27. The method of claim 26, wherein the logic gates and delay element include a two-input NAND gate and a two-input NOR gate, wherein each of the two-input NAND gate and two input NOR gate receive as inputs the DPD signal and a delayed version of the DPD signal through a respective first delay element and second delay element, the first delay element and the second delay element having different predetermined delay values.

28. The method of claim 25, further including the step of controlling at least one third transistor by the first DPD signal through a turn-on delay element wherein the first transistor is first turned on by the first DPD signal to apply the bias voltage (VCC) to the operating voltage output node when exiting DPD and the at least one third transistor is turned on by the first DPD signal after a turn-on delay provided by the turn-on delay element to increase drive capacity at the operating voltage output node.

* * * * *